United States Patent [19]

Farnworth et al.

[11] Patent Number: 5,756,370
[45] Date of Patent: May 26, 1998

[54] COMPLIANT CONTACT SYSTEM WITH ALIGNMENT STRUCTURE FOR TESTING UNPACKAGED SEMICONDUCTOR DICE

[75] Inventors: Warren M. Farnworth, Nampa; Salman Akram, Boise, both of Id.

[73] Assignee: Micron Technology, Inc., Boise, Id.

[21] Appl. No.: 597,422

[22] Filed: Feb. 8, 1996

[51] Int. Cl.⁶ .................................................. H01L 21/66
[52] U.S. Cl. .................... 438/15; 438/117; 438/611; 438/52
[58] Field of Search ........................ 438/14, 15, 52, 438/611, 117

[56] References Cited

U.S. PATENT DOCUMENTS

| | | | |
|---|---|---|---|
| 3,550,261 | 12/1970 | Schroeder | 438/611 |
| 4,096,348 | 6/1978 | Robillard et al. | 438/611 |
| 4,553,192 | 11/1985 | Babuka et al. | 361/395 |
| 5,006,792 | 4/1991 | Malhi et al. | 324/158 F |
| 5,051,379 | 9/1991 | Bayer et al. | 437/225 |
| 5,072,289 | 12/1991 | Sugimoto et al. | 357/68 |
| 5,073,117 | 12/1991 | Malhi et al. | 439/71 |
| 5,088,190 | 2/1992 | Malhi et al. | 29/843 |
| 5,090,118 | 2/1992 | Kwon et al. | 29/843 |
| 5,128,850 | 7/1992 | Elder et al. | 439/67 |
| 5,225,037 | 7/1993 | Elder et al. | 156/644 |
| 5,302,891 | 4/1994 | Wood et al. | 324/158 F |
| 5,367,253 | 11/1994 | Wood et al. | 324/158.1 |
| 5,408,190 | 4/1995 | Wood et al. | 324/765 |
| 5,440,240 | 8/1995 | Wood et al. | 324/765 |
| 5,487,999 | 1/1996 | Farnworth | 437/7 |
| 5,559,444 | 9/1996 | Farnworth et al. | 324/754 |

OTHER PUBLICATIONS

Yamamoto, Yasuhiko et al., "Evaluation of New Micro-Connection System Using Microbumps", Technical Paper, Nitto Denko Corporation, ISHM 1993 Proceedings, pp. 370–378.

*Primary Examiner*—Kevin Picardat
*Attorney, Agent, or Firm*—Stephen A. Gratton

[57] ABSTRACT

A compliant contact system for making a temporary electrical connection with a semiconductor die for testing and a method for fabricating the compliant contact system are provided. The compliant contact system is adapted for use with a test apparatus for known good die. The compliant contact system includes an interconnect, and can include an alignment fixture for aligning the die with the interconnect. The interconnect includes a pattern of compliant contacts adapted to contact the bond pads on the die. The compliant contacts are formed as metal traces on a silicon substrate. The end portions of the metal traces are cantilevered over a pit etched into the substrate, and are adapted to flex to compensate for dimensional variations in the bond pads and to provide a bias force against the bond pads.

24 Claims, 5 Drawing Sheets

COMPLIANT CONTACT SYSTEM WITH ALIGNMENT STRUCTURE FOR TESTING UNPACKAGED SEMICONDUCTOR DICE

FIELD OF THE INVENTION

This invention relates to semiconductor manufacture and more particularly to an improved compliant contact system for making temporary electrical connections with unpackaged semiconductor dice and to a method for fabricating the compliant contact system.

BACKGROUND OF THE INVENTION

Microelectronics packages, called hybrids or multi chip modules, utilize unpackaged semiconductor dice. Because of an increased use of hybrids, semiconductor manufacturers are required to supply unpackaged dice that have been tested and certified as known good die (KGD). A known good die (KGD) is an unpackaged die having the same reliability as the equivalent packaged die.

The need for known good dice has led to the development of test apparatus suitable for testing unpackaged semiconductor dice. As an example, test apparatus for conducting burn-in tests for unpackaged dice are disclosed in U.S. Pat. Nos. 5,302,891; 5,408,190 and 5,483,174 to Wood et al., which are assigned to Micron Technology, Inc.

With this type of test apparatus, a non-permanent electrical connection must be made between contact locations on the die, such as bond pads, and external test circuitry. The bond pads provide a connection point for testing the integrated circuits formed on the die. The test apparatus typically includes some type of interconnect having a pattern of contact members for effecting the temporary electrical connection to the bond pads on the die.

In making this temporary electrical connection, it is desirable to form a connection that causes as little damage as possible to the bond pads on the die. If the contact members for the interconnect damage the bond pads, the entire die may be rendered as unusable. This is difficult to accomplish because the contact members must also produce a low resistance or ohmic contact with the bond pads. It is also desirable for the contact members to accommodate dimensional variations in the bond pads, particularly variations in a z-direction. For this reason contact members for interconnects are sometimes constructed as flexible or compliant members that can move up or down upon contact with the bond pads.

In view of the foregoing, it is an object of the present invention to provide an improved compliant contact system for making temporary electrical connections to unpackaged semiconductor dice and a method for fabricating the compliant contact system. It is yet another object of the present invention to provide an improved compliant contact system for testing unpackaged semiconductor dice that can be fabricated out of silicon using semiconductor circuit fabrication techniques. It is a further object of the present invention to provide an improved compliant contact system that includes an interconnect with raised contact members and an alignment fixture for mechanically aligning contact locations on the die with corresponding contact members on the interconnect. Other objects, advantages and capabilities of the present invention will become more apparent as the description proceeds.

SUMMARY OF THE INVENTION

In accordance with the present invention, a compliant contact system for making temporary electrical connections with an unpackaged semiconductor die, and a method for fabricating the compliant contact system are provided. The compliant contact system includes an interconnect and can include an alignment fixture. Both the interconnect and alignment fixture can be fabricated out of silicon, or a similar material, using semiconductor circuit fabrication processes.

The interconnect includes a substrate and a pattern of compliant contact members formed on the substrate. The compliant contact members are formed as metal traces having cantilevered end portions formed over a pit etched into the substrate. The end portions of the metal traces are adapted to contact flat or bumped bond pads on a die, and to flex in the z-direction to accommodate dimensional variations and to provide a biasing force against the bond pad.

The metal traces can be formed on the substrate by depositing, patterning and then etching a high yield strength metal, such as tungsten or titanium. The cantilevered end portions of the metal traces can be formed with a bump for contacting a flat bond pad or with a flat surface for contacting a bumped bond pad. In addition, the metal traces can be formed with a rough textured surface having pointed asperities for penetrating the bond pads on the die to a limited penetration depth.

The alignment fixture attaches directly to the interconnect and includes an etched alignment opening adapted to mechanically align the die with the interconnect. In addition, the alignment fixture includes etched access openings which provide access for electrically connecting the metal traces on the interconnect to external test circuitry. The electrical connection to the metal traces can be made by wire bonding or by a mechanical electrical connector such as a clip or slide connector.

Preferably, a large number of interconnects and alignment fixtures are formed on wafers using masking, etching and deposition processes. After being fabricated separately, the wafers are aligned, bonded together and then singulated to form a plurality of separate compliant contact systems. Each compliant contact system can be used with a test apparatus for testing an unpackaged die. Alternately, the compliant contact system can be used in a test apparatus without the alignment fixture and aligned with the die using optical alignment techniques.

BRIEF DESCRIPTION OF THE DRAWINGS

FIG. 1GG is an enlarged schematic cross sectional view of a contact surface for a contact member of the compliant contact system that has optionally been formed with a rough textured surface;

DETAILED DESCRIPTION OF THE PREFERRED EMBODIMENT

Figure 1A:
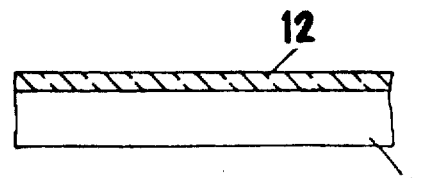
FIGS. 1A–1G are schematic cross sectional views illustrating process steps for fabricating a compliant contact system in accordance with the invention.

Referring to FIGS. 1A–1E, process steps for forming a compliant contact system in accordance with the invention are shown. Initially, as shown in FIG. 1A, a substrate 10 is formed or provided. The substrate 10 is formed of a material having a coefficient of thermal expansion (CTE) that closely matches the CTE of a silicon die. Suitable materials for the substrate include monocrystalline silicon, silicon-on-glass, silicon-on-sapphire, germanium, or ceramic. The substrate 10 is preferably formed as a wafer of material that will subsequently be singulated to form a plurality of compliant contact systems.

As also shown in FIG. 1A, an insulating layer 12 is formed on the substrate 10. The insulating layer 12 can be formed of a deposited or grown layer of material. For a substrate 10 formed of silicon, the insulating layer 12 can be a layer of $SiO_2$ formed using a low temperature plasma enhanced chemical vapor deposition process (PECVD). A plasma for the PECVD process can include $O_2$ and a silicon containing species such as silane (silicon tetrahydride-$SiH_4$) or TEOS, (tetraethylorthosilicate). A representative thickness for the insulating layer 12 can be from 1 μm to 10 μm. Alternately in place of $SiO_2$ the insulating layer 12 can be formed of $Si_3N_4$ or other dielectric material using a suitable deposition process.

Figure 1B:
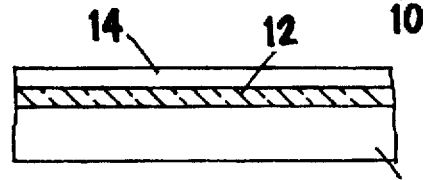

After the insulating layer 12 is formed and as shown in FIG. 1B, a first metal layer 14 is formed on the insulating layer 12. The first metal layer 14 will subsequently be patterned and etched to form metal traces 16 (FIG. 1F). The first metal layer 14 can be blanket deposited to a thickness of about 1 μm–10 μm using a deposition process such as CVD. Preferably, the first metal layer 14 is formed of a high yield strength metal, such as tungsten (W) or titanium (Ti). Other suitable metals can include nickel (Ni), platinum (Pt), iridium (Ir) and vanadium (V).

Figure 1C:
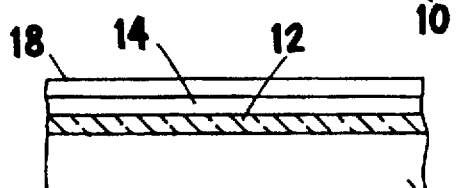
Figure 4:
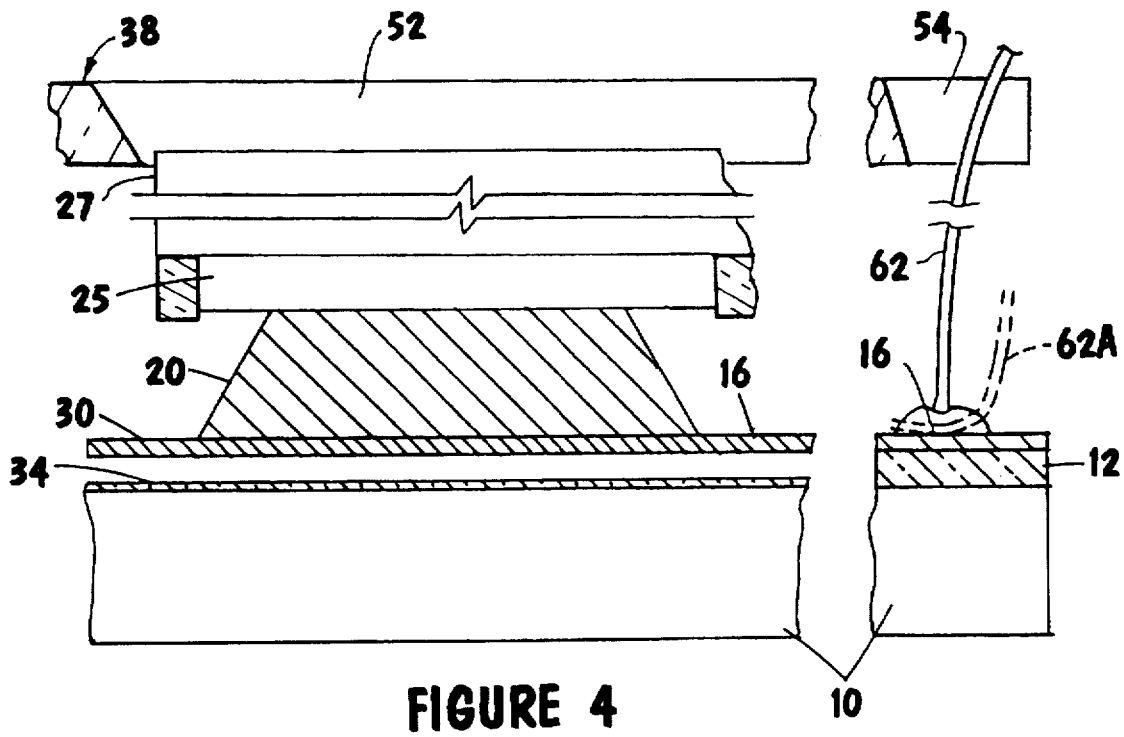
FIG. 4 is an enlarged schematic cross sectional view illustrating a metal trace of the compliant contact system in electrical contact with a bond pad of a semiconductor die.

Next, as shown in FIG. 1C, a second metal layer 18 is formed on the first metal layer 14. The second metal layer 18 will subsequently be patterned and etched to form metal bumps 20 (FIG. 1F). As will be further explained, the metal bumps 20 are adapted to contact flat bond pads 25 (FIG. 4) on a semiconductor die 27 (FIG. 4). The second metal layer 18 can be blanket deposited to a thickness of about 600 Å–2000 Å using a deposition process such as CVD.

Suitable metals for forming the second metal layer 18 can include aluminum (Al), copper (Cu), gold (Au) and palladium (Pd), as well as the previously identified metals for fabricating the first metal layer 16.

Figure 1D:
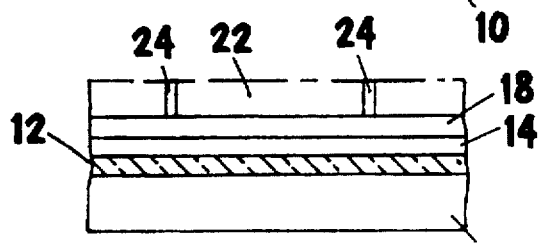

After the initial deposition process and as shown in FIG. 1D, the second metal layer 18 is covered with a layer of resist 22 which is photopatterned and developed to form an etch mask 24. The second metal layer 18 is then etched using the etch mask 24 to form the pattern of metal bumps 20. Solid portions of the etch mask 24 will correspond to the locations of the bumps 20.

Depending on the material, the second metal layer 18 can be etched to form the metal bumps 20 using a wet or dry etch process. Alternately, in place of a metallization process (i.e., deposition, patterning, etching) to form the metal bumps 20, a plating process, such as electroplating, or electroless deposition can be used. For example, Ni, Cu, Au and Pd can be deposited by electroless deposition using aqueous solutions comprising metal ions and reducing agents. As another alternative, the metal bumps 20 can be formed using an evaporation process similar to metal mask technology used to form bumps on the bond pads of semiconductor dice. In this case, the metal can be evaporated through a metal mask to form the bumps 20 in the required pattern on the first metal layer 18.

The metal bumps 20 can be formed with a diameter of about 30 μm to 100 μm and in a pattern that matches the pattern of the bond pads 25 (FIG. 4) on the die 27 (FIG. 4). The shape and size of the bumps 20 will be determined by the formation process and by the parameters of the process. For example, the bumps 20 can be formed with straight walls as would result from an etching process or with convex walls and a circular cross section as would result from a plating or evaporation process. In FIG. 4, the bumps 20 are illustrated as generally rectangular in cross section with straight walls and a flat top portion. Alternately, instead of forming the bumps 20, the surface of the metal traces 16 can be left flat for contacting a bumped die (not shown).

Figure 1E:
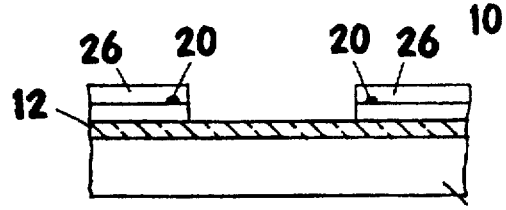
Figure 1F:
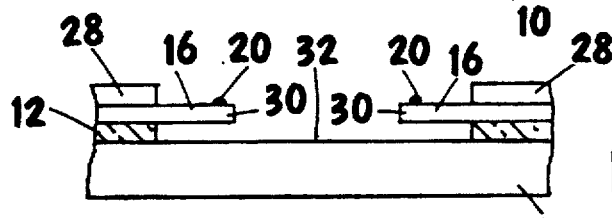
Figure 1G:
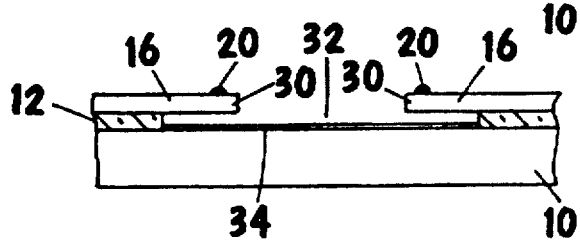
Figure 1G:
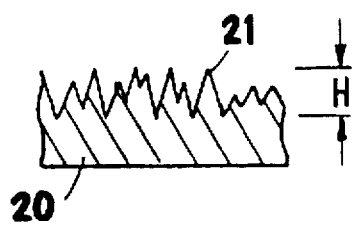

As another alternative and as shown in FIG. 1GG, the bumps 20 (or flat surface of the metal traces 16) can be formed with a rough textured surface having sharp asperities 21. The sharp asperities 21 are formed with a height "H" and are adapted to penetrate the bond pads 25 (FIG. 4) on the die 27 (FIG. 4) to a limited penetration depth. Formation of the rough textured surface can be with a plating process or an etching process as disclosed in U.S. Pat. No. 5,487,999, incorporated herein by reference.

After formation of the bumps 20 and as shown in FIG. 1E, a second etch mask 26 is formed over the metal bumps 20 and over the first metal layer 14. The second etch mask 26 can be formed by depositing, patterning and developing a layer of photoresist. Using the second etch mask 26, the first metal layer 14 is etched to form the pattern of metal traces 16 (FIG. 1F). Each metal trace 16 includes a metal bump 20 formed on an end portion 30 thereof.

Depending on the material, etching of the first metal layer 14 can be with a wet or dry etch process. For example, with the first metal layer 14 formed of tungsten, dry etching can be performed using a reactive ion etcher (RIE) and a fluorine based (e.g., $SF_6$) or chlorine based (e.g., $CCl_4$) chemistry.

Next, as shown in FIG. 1F, a third etch mask 28 is formed over the substrate 10. The third etch mask 28 includes an opening sized and located to etch the insulating layer 12 to form a pit 32. For an insulating layer 12 formed of silicon dioxide, dry etching to form the pit 32 can be performed using a chlorine or fluorine etching species such as $CF_4$, $CHF_3$, $C_2F_6$ or $C_3F_8$. Parameters of the etch process can be controlled to end point the etch so that the substrate 10 is substantially unaffected. The depth "D" of the etched pit 32 is thus substantially equal to the originally deposited thickness of the insulating layer 12. The pit 32 can also be made deeper than the thickness of the insulating layer 12 by etching into the substrate 10. For a substrate 10 formed of silicon, etching can be with a mixture of $KOH:H_2O$.

As with the previous etch masks, the third etch mask 28 can be formed of photoresist. Alternately, the third etch mask 28 can be formed as a hard mask out of a material such as silicon nitride ($Si_3N_4$). The third etch mask 28 is constructed such that the insulating layer 12 supporting the end portions 30 of the metal traces 16 is undercut and removed by the etchant. The sides of the pit 32 are thus subjacent to the metal traces 16 but the end portions 30 of the traces 16 are cantilevered over the pit 32. The length of the cantilevered end portions 30 of the metal traces 16 can be from several mils to a fraction of an inch.

The end portions 30 are adapted to flex upon contact with the bond pad 25 to accommodate dimensional variations in the z-direction and to provide a biasing force against the bond pad 25 (FIG. 4). The biasing force or spring constant (C) produced by each cantilevered end portion 30 is dependent on its dimensions and material. These parameters can be related by the formula:

$$C = (Ewt^3)/(4l^3)$$

where C is the spring constant w is the width of the end portion 30 t is the thickness of the end portion 30 l is the length of the end portion 30

E is the modulus of elasticity of metal traces 16

Following formation of the pit 32 and as shown in FIG. 1G, a thin insulating layer 34 is formed on the bottom surface and on the sidewalls of the pit 32. As with the previously insulating layer 12, the thin insulating layer 34 can be deposited using plasma CVD techniques. The thin insulating layer 34 must be made very thin so that the etched pit 32 is not completely filled. By way of example, the thin insulating layer 34 can have a thickness of from 500 Å to 1000 Å. The depth of the completed pit 32 will be equivalent to the difference between the thickness of the insulating layer 12 (FIG. 1A) and the thin insulating layer 34 (FIG. 1G). Insulating layer 34 is selectively deposited such that the conductive metal traces 16 and 20 are not covered by it. Standard masking techniques can be employed.

Figure 2:
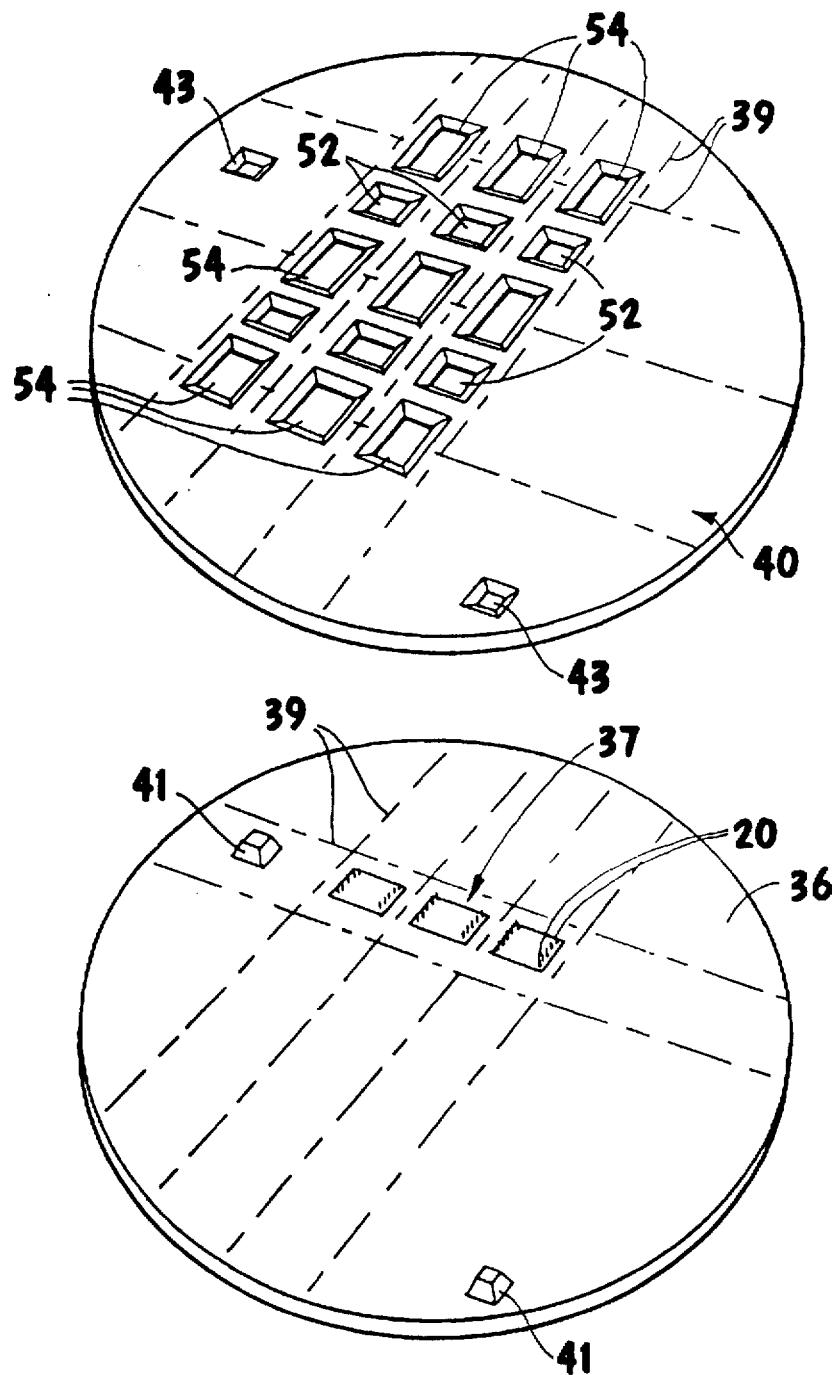
FIG. 2 is a schematic perspective view of a wafer level process for forming a plurality of compliant contact systems.

Following the deposition and etching steps outlined in FIGS. 1A–1G and as shown in the lower portion of FIG. 2, the substrate wafer 36 can be singulated along saw cut lines 39 to form a large number of separate interconnects 37. Each interconnect 37 can be used in a test apparatus such as disclosed in the previously cited U.S. Pat. Nos. 5,302,891, 5,408,190 and 5,483,174 to Wood et al., incorporated herein by reference. Mounted within such a test apparatus, the interconnect 37 makes a temporary electrical connection between the die 27 (FIG. 4) held in the test apparatus and external test circuitry. With such a test apparatus, alignment between the die 27 and interconnect 37 can be accomplished using optical alignment techniques as described in the above cited patents.

Figure 3:
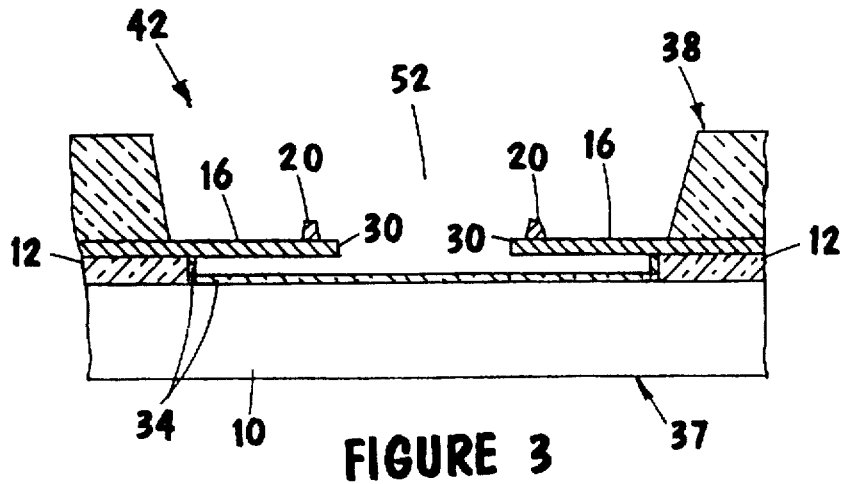
FIG. 3 is a schematic cross sectional view of a compliant contact system.

Alternately, as shown in FIG. 3, the interconnect 37 can be assembled with an alignment fixture 38 to form a compliant contact system 42 having mechanical alignment capabilities. As with the interconnect 37 used separately, the compliant contact system 42 having the alignment fixture 38 is adapted for use with a test apparatus as disclosed in the above cited patents. As shown in FIG. 4, the alignment fixture 38 is adapted to align the bond pads 25 on the semiconductor die 27 to the metal bumps 20 on the interconnect 37. With the bond pads 25 on the die 27 and the bumps 20 on the interconnect 37 biased into contact by a force applying mechanism of the test apparatus, a temporary electrical path can be provided from external test circuitry to the test apparatus for testing the die 27.

Referring back again to FIG. 2, the compliant contact system 42 of FIG. 3 is preferably assembled at the wafer level and then singulated. Specifically, prior to the singulation process the substrate wafer 36 can be bonded to an alignment wafer 40 using an adhesive layer 60 (FIG. 3). The substrate wafer 36 and alignment wafer 40 can then be singulated along saw cut lines 39 to form the compliant contact system 42 shown in FIG. 3. To facilitate assembly of the substrate wafer 36 and alignment wafer 40, alignment pins 41 can be formed on the substrate wafer 36 for mating engagement with alignment openings 43 formed on the alignment wafer 40.

Figure 5A:
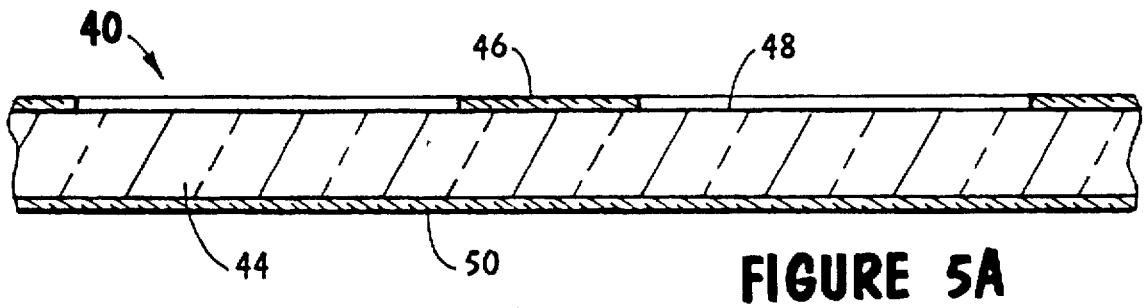
FIGS. 5A–5D are schematic cross sectional views illustrating wafer level steps in the formation of an alignment fixture for the compliant contact system.

Referring to FIGS. 5A–5D, wafer level steps used in the fabrication of the alignment fixture 38 are shown. As shown in FIG. 5A, the alignment wafer 40 includes a substrate 44 preferably formed of silicon or a similar material as previously described. Initially a hard mask 46 is formed on the substrate 44. The hard mask 46 can be formed of a material, such as silicon nitride ($Si_3N_4$), that is initially deposited to a thickness of about 500 Å to 3000 Å using a suitable deposition process such as CVD. This material is then photopatterned and etched. The hard mask 46 includes openings 48 for etching the substrate 44. An etch stop layer 50, preferably of a same material as the hard mask 46, is also formed on the opposite surface substrate 44.

Figure 5B:
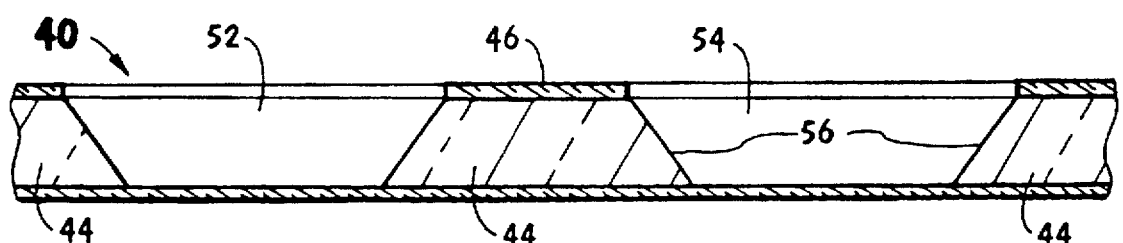

Next, as shown in FIG. 5B, the substrate 44 is etched to form a pattern of openings including alignment openings 52 and access openings 54. Typical etching techniques with the alignment wafer 40 formed of silicon comprise wet anisotropic etching with a mixture of KOH:$H_2O$. This type of etching is also known in the art as bulk micro-machining. With an anisotropic etch the sidewalls 56 of the openings 52, 54 will be sloped at an angle of about 54° with the horizontal. The openings 52, 54 are etched through the full thickness of the substrate 44 using the etch stop layer 50 as an end point.

Figure 5C:
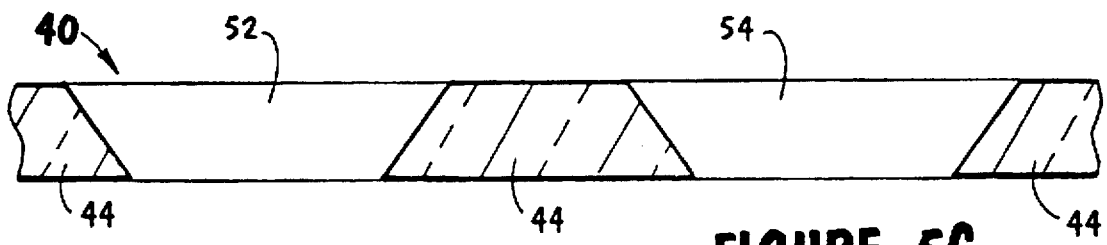

Next, as shown in FIG. 5C, the hard mask 46 and the etch stop layer 50 are removed. For a hard mask 46 and etch stop layer 50 formed of silicon nitride, an etchant such as $H_3PO_4$ that is selective to the substrate 44 can be used.

Figure 5D:
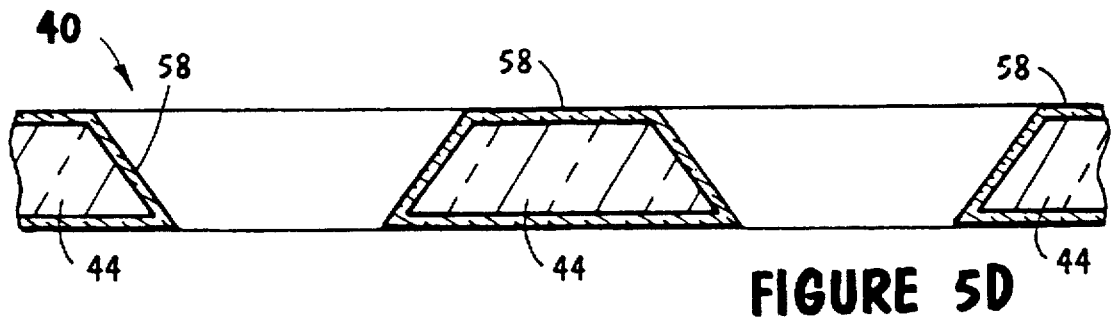

Next, as shown in FIG. 5D, an insulating layer 58 is formed on all exposed surfaces of the substrate 44. The insulating layer 58 can be an oxide such as $SiO_2$ formed by an oxidation process as previously described. The insulating layer 58 electrically insulates the completed alignment fixture 38 (FIG. 3) from other components in the assembled compliant contact system 42.

Figure 6:
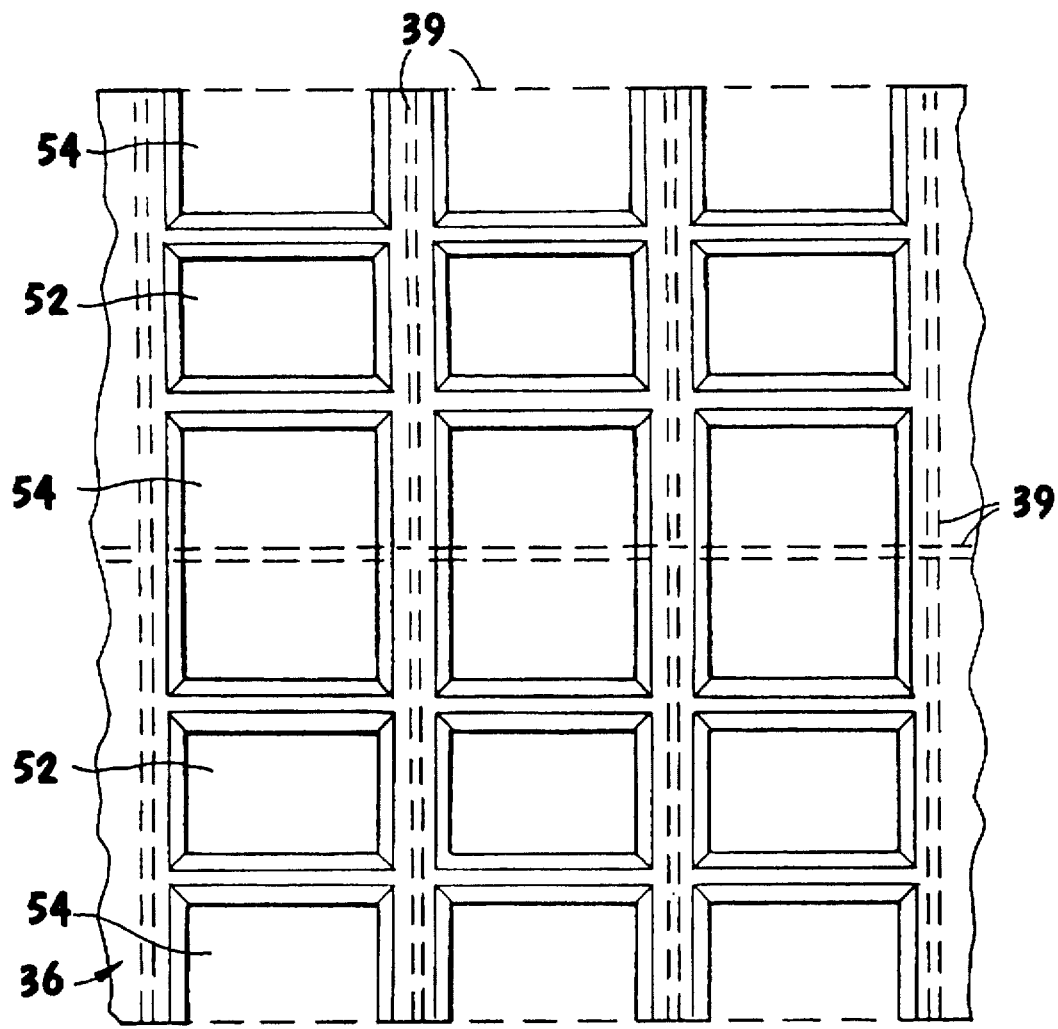
FIG. 6 is an enlarged plan view of an alignment wafer showing the location of saw cut lines for singulating the wafer into a plurality of alignment fixtures.

As shown in FIG. 6, each alignment opening 52 includes an access opening 54 on either side. The saw cut lines 39 bisect the access openings 54 so that each saw cut ultimately forms two access openings 54. Each singulated fixture 38 (FIG. 3) includes an alignment opening 52 and a pair of access openings 54. As shown in FIG. 3, in the assembled compliant contact system 42, the access openings 54 allow access for an electrical connection to the metal traces 16. This allows bond wires 62 (FIG. 4) or mechanical electrical connectors 62A (FIG. 4) to be attached to the metal traces 16 for establishing a conductive path from external test circuitry to the bond pads 25 on the die 27.

Thus the invention provides a compliant contact system including an interconnect having compliant contacts and an associated alignment fixture. Advantageously, the compliant contact system can be formed with integrated circuit precision using semiconductor fabrication techniques such as masking, etching and deposition.

Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

What is claimed is:

1. A method for fabricating an interconnect for a semiconductor die comprising:

providing a substrate;

forming a first layer on the substrate;

forming a metal trace on the first layer, the metal trace having a thickness "t", a width "w" and a modulus of elasticity "E";

etching the first layer to undercut a portion of the first layer supporting an end portion of the metal trace and form a pit proximate to the end portion, with the end portion having a length "l" cantilevered over the pit and adapted to flex upon contact with the contact location; and selecting "t", "w", "E" and "l" to form the end portion with a desired spring constant "C".

2. The method as claimed in claim 1 further comprising forming a metal bump on the end portion.

3. The method as claimed in claim 2 wherein forming the metal bump comprises a process selected from the group consisting of metallization, plating and evaporation.

4. The method as claimed in claim 1 wherein the substrate comprises a wafer and the wafer is singulated to form a plurality of interconnects.

5. The method as claimed in claim 1 further comprising providing an alignment fixture with an alignment opening for the die and attaching the alignment fixture to the substrate.

6. The method as claimed in claim 1 wherein the metal trace comprises a metal selected from the group consisting of tungsten, titanium, nickel, platinum, iridium and vanadium.

7. The method as claimed in claim 1 wherein the metal trace includes a bump comprising a metal selected from the group consisting of tungsten, titanium, nickel, platinum, iridium, gold and copper.

8. The method as claimed in claim 7 further comprising forming the bump with a rough textured surface having asperities for penetrating the contact location on the die.

9. A method for fabricating an interconnect for a semiconductor die comprising:

providing a substrate wafer;

forming a first layer on the substrate wafer;

forming a plurality of metal traces on the first layer, each metal trace having a thickness "t", a width "w" and a modulus of elasticity "E";

etching the first layer to undercut portions of the first layer supporting end portions of the metal traces and form a pit proximate to the end portions, with the end portions of each metal trace having a length "l" cantilevered over the pit and adapted to flex upon contact with a contact location on the die;

singulating the substrate wafer to define a periphery of the interconnect; and selecting "t", "w", "E" and "l" to form the end portions with a desired spring constant "C".

10. The method as claimed in claim 9 further comprising providing an alignment wafer having a plurality of alignment openings and attaching the alignment wafer to the substrate wafer prior to the singulating step.

11. The method as claimed in claim 9 further comprising forming metal bumps on the end portions.

12. The method as claimed in claim 11 further comprising forming a rough textured surface on the metal bumps.

13. The method as claimed in claim 9 wherein the substrate comprises silicon and the first layer comprises an electrically insulating material.

14. The method as claimed in claim 9 wherein the substrate wafer comprises a material selected from the group consisting of silicon, silicon-on-glass, silicon-on-sapphire, germanium, or ceramic.

15. The method as claimed in claim 9 wherein the metal traces comprise a material selected from the group consisting of tungsten, titanium, nickel, platinum and iridium.

16. A method for fabricating an interconnect for a semiconductor die comprising:

providing a substrate;

forming a first layer on the substrate;

forming a metal trace on the first layer, the metal trace having a thickness "t", a width "w" and a modulus of elasticity "E", the metal trace having a contact portion configured to electrically engage a contact location on the die;

etching the first layer to an endpoint of the substrate to undercut a portion of the first layer supporting the contact portion, and to cantilever the contact portion over the substrate by a length "l"; and selecting "t", "w", "E" and "l" to form the contact portion with a desired spring constant "C".

17. The method as claimed in claim 16 further comprising following the etching step, forming a second layer on the substrate proximate to the contact portion.

18. The method as claimed in claim 16 further comprising following the etching step, etching the substrate proximate to the end portion to form a pit in the substrate proximate to the contact portion.

19. The method as claimed in claim 16 further comprising forming a rough textured surface on the contact portion.

20. The method as claimed in claim 16 further comprising forming a metal bump on the contact portion.

21. A method for fabricating an interconnect for a semiconductor die comprising:

providing a substrate;

forming a first layer on the substrate;

forming a metal trace on the first layer, the metal trace having a thickness "t", a width "w" and a modulus of elasticity "E", the metal trace having a contact portion configured to electrically engage a contact location on the die;

etching the first layer to form a pit proximate to the contact portion, with the contact portion having a length "l" cantilevered over the pit; and selecting "t", "w", "E" and "l" to form the contact portion with a desired spring constant "C".

22. The method as claimed in claim 21 further comprising etching the substrate to form the pit.

23. The method as claimed in claim 21 further comprising forming the first layer with a second thickness and endpointing the etching step on the substrate such that the pit has a depth approximately equal to the second thickness.

24. The method as claimed in claim 21 further comprising following the etching step forming an electrically insulating layer on the pit.

* * * * *